United States Patent [19]

Hu

[11] Patent Number: 5,715,194
[45] Date of Patent: Feb. 3, 1998

[54] BIAS SCHEME OF PROGRAM INHIBIT FOR RANDOM PROGRAMMING IN A NAND FLASH MEMORY

[75] Inventor: Chung-You Hu, Sunnyvale, Calif.

[73] Assignee: Advanced Micro Devices, Inc., Sunnyvale, Calif.

[21] Appl. No.: 686,641

[22] Filed: Jul. 24, 1996

[51] Int. Cl.$^6$ ................................... G11C 11/34
[52] U.S. Cl. ...................... 365/185.17; 365/185.18
[58] Field of Search ..................... 365/185.17, 104, 365/185.33, 185.18

[56] References Cited

U.S. PATENT DOCUMENTS 5,572,464  11/1996  Iwasa ........................... 365/185.17

Primary Examiner—Joseph A. Popek
Attorney, Agent, or Firm—Sawyer & Associates

[57] ABSTRACT

The present invention is a system and method which allows random programming and avoids the problem with band-to-band tunneling current discussed above. In particular, the present invention applies a predetermined voltage along the wordlines adjacent to the programming wordline. A method of programming in a Flash memory system includes providing a first wordline coupled with a first device desired to be programmed, the first wordline also coupled with a second device desired to be program inhibited; electrically isolating the second device; programming the first device; and programming a third device coupled with a second wordline, the second wordline not being adjacent to the first wordline.

22 Claims, 8 Drawing Sheets

BIAS SCHEME OF PROGRAM INHIBIT FOR RANDOM PROGRAMMING IN A NAND FLASH MEMORY

FIELD OF THE INVENTION

The present invention relates generally to a Flash memory architecture. More particularly, the present invention is an improved Flash memory architecture which allows random programming.

BACKGROUND OF THE INVENTION

The typical architecture used for Flash memories include a plurality of wordlines intersected with a plurality of bitlines. Typically, floating gate devices are located at each intersection of wordlines and bitlines. Prior to the first wordline and after the last wordline, are a select gate drain and a select gate source along the bitline. Each floating gate device is coupled to the next floating gate device by coupling the source of one device to the drain of the next device.

Initially, the floating gate devices are erased to a certain threshold voltage such as −2 volts. In order to program the memory, the selected floating gate devices are charged to a higher threshold voltage while the threshold voltage of the remaining floating gate devices stay unchanged.

A problem arises when it is desirable to program one floating gate device along a wordline without programming the next floating gate device on the same wordline. When a voltage is applied along a wordline, the voltage is applied not only to the desired floating gate device but also to the floating gate devices along the same wordline which are unselected for programming.

More background information on the subject can be found in "A 3.3v 32 Mb NAND Flash Memory with Incremental Stop Pulse Programming Scheme," IEEE J. Solid-State-Circuits, Vol. 30, no. 11, 1995, p.1149; and "A 35ns Cycle Time 3.3v only 32Mb NAND Flash EEPROM," IEEE J. Solid-State-Circuits, Vol. 130, no. 11, 1995, p.1157.

A special architecture is typically required when a high voltage, such as 18 volts, is desired to be used on the programming wordline. The programming wordline is typically isolated to solve problems associated with using a high voltage on the programming wordline. In order to facilitate this architecture, the floating gate devices prior to the target device on the selected bitline need to be turned on to allow the target device to be programmed. Additionally, the floating gate devices adjacent to the devices desired to be program inhibited along the programming wordline needs to be turned off to allow those devices to be program inhibited. The typical method used on the conventional system when using high voltage for programming is to erase all of the floating gate devices then program from the bottom working up sequentially. This inability to randomly program the floating gate devices is not sufficiently flexible for many applications.

Another problem with the conventional system and method is that a band-to-band tunneling current can occur with the adjacent floating gate devices. This band-to-band tunneling current raises the voltage differential in the floating gate device which can initiate unwanted programming.

Accordingly, what is needed is a system and method which allows random programming. The system should be simple, cost effective and easily implementable using existing technologies. The present invention addresses such a need.

SUMMARY OF THE INVENTION

The present invention is a system and method which allows random programming and avoids the problem with band-to-band tunneling current discussed above. In particular, the present invention applies a predetermined voltage (for example, 2 volts) along the wordlines adjacent to the programming wordline. A method of programming in a Flash memory system includes providing a first wordline coupled with a first device desired to be programmed, the first wordline also coupled with a second device desired to be program inhibited; electrically isolating the second device; programming the first device; and programming a third device coupled with a second wordline, the second wordline not being adjacent to the first wordline.

DETAILED DESCRIPTION OF THE INVENTION

The present invention is directed toward an improvement in a Flash memory architecture. More particularly, the present invention provides a small voltage to a plurality of wordlines which are adjacent to the programming wordline.

The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
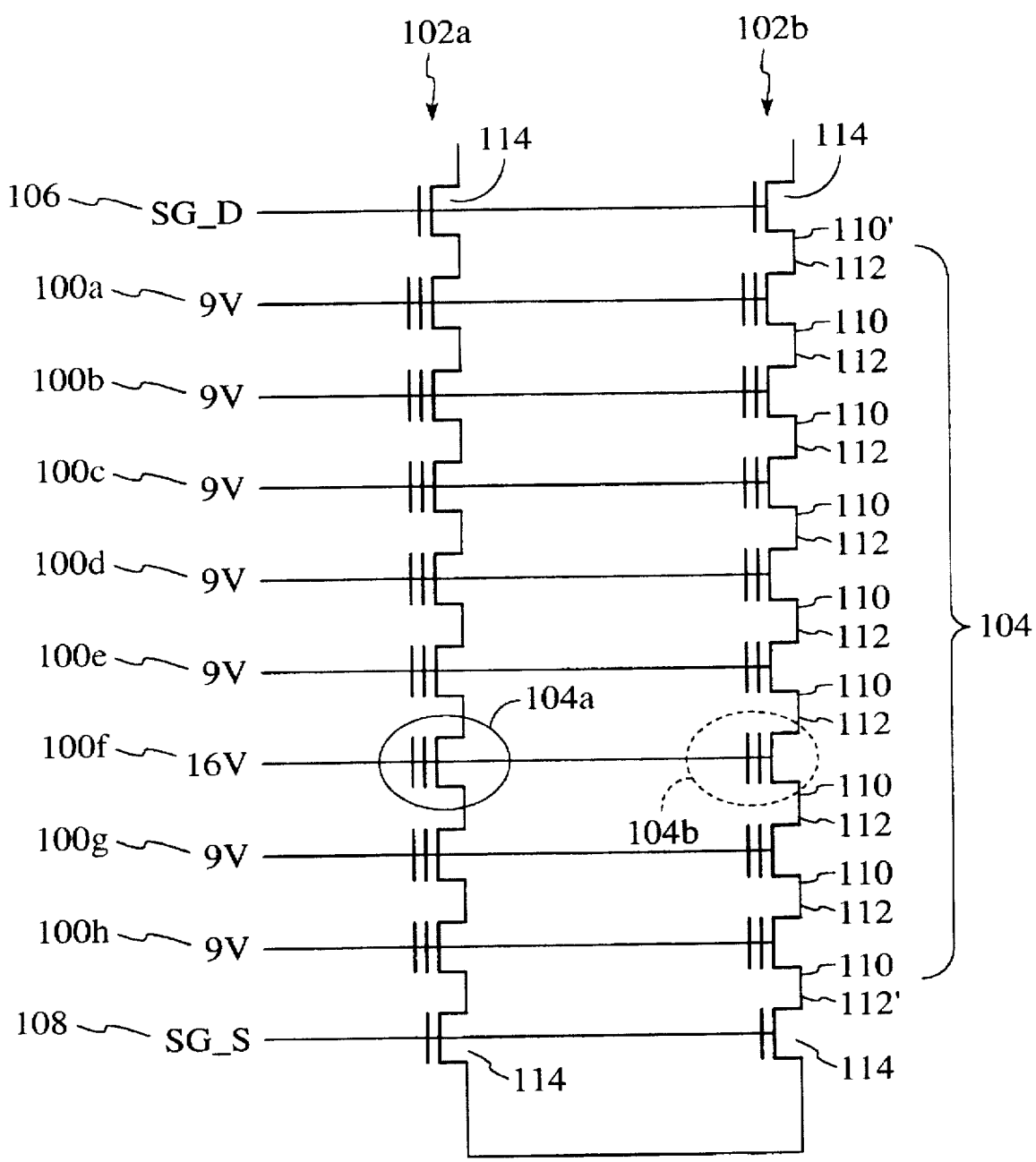
FIG. 1 is a schematic depiction of a conventional Flash memory.

FIG. 1 illustrates a basic diagram of a Flash memory 10A, otherwise known as a Flash electrically erasable programmable read only memory (EEPROM). As shown in FIG. 1, the typical architecture used for Flash memories 10A include a plurality of wordlines 100a–100h intersected with a plurality of bitlines 102a–102b. Located at each intersection of wordlines 100 and bitlines 102 are floating gate devices 104. Prior to the first wordline 100 and after the last wordline 100, are a select gate drain 106 and a select gate source 108 along the bitline 102. Each of the floating gate devices 104 is coupled to the next floating gate device 104 by coupling the source 110 of one device to the drain 112 of the next device.

In order to program the memory 10A, some floating gate devices 104 are charged while others remain uncharged. To charge or program a single floating gate device 104 within the array, a voltage differential must be created within the floating gate device 104.

Figure 2:
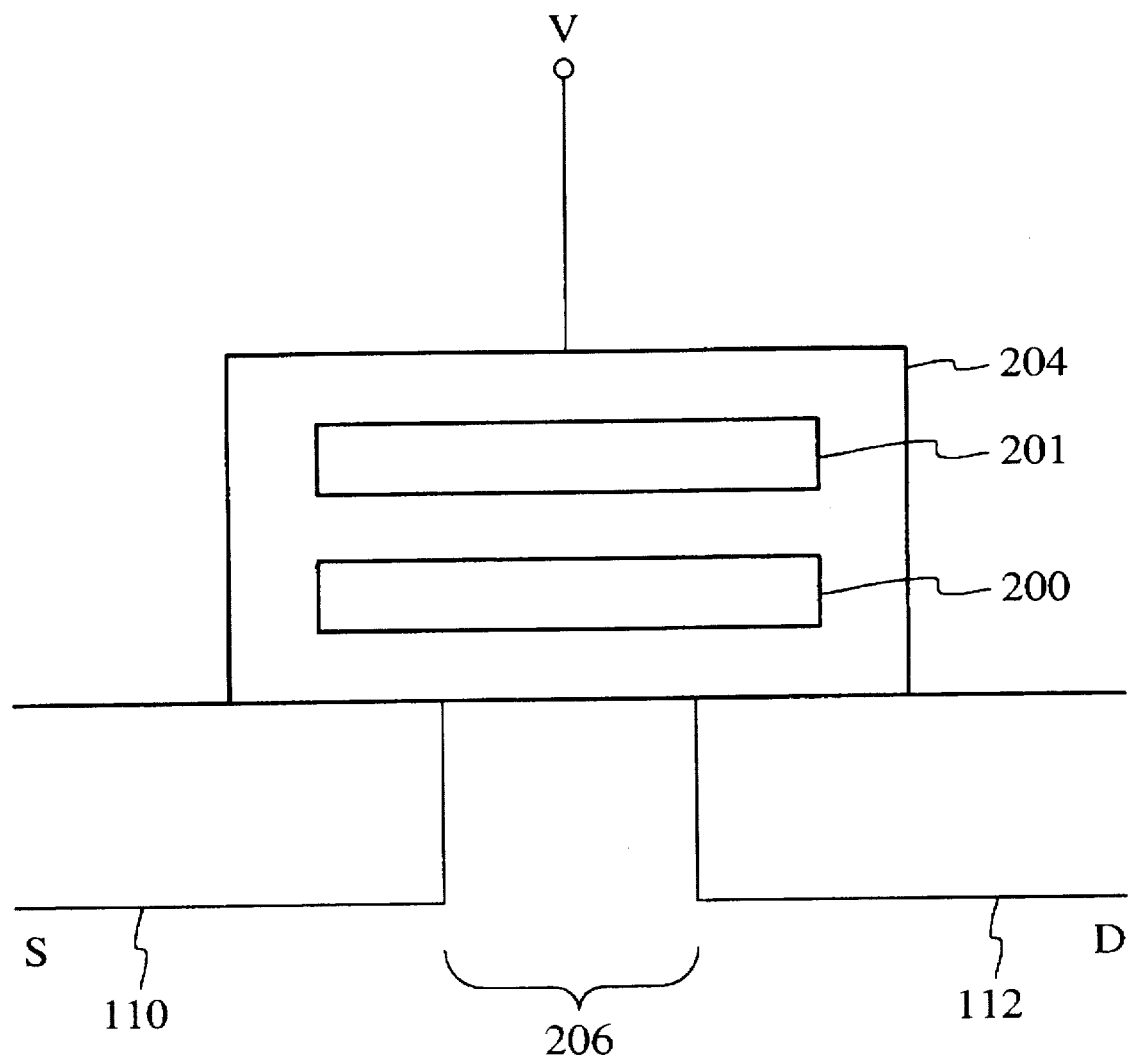
FIG. 2 is an illustration of a floating gate device.

FIG. 2 illustrates a schematic of a floating gate device 104. It includes a control gate 201, a floating gate 200, a source 110, a drain 112, and a channel region 206. A voltage differential is created in the floating gate device 104 when there is a high voltage at the floating gate (Vg) 200 and a low voltage at the channel region (Vch) 206. This voltage difference causes electrons to move from the channel region 206 to the floating gate 200. This movement of electrons from the channel region 206 to the floating gate 200 is referred to as programming. When programming, the high voltage at the floating gate 200 is created by applying a voltage to the wordline 100 associated with the particular floating gate device 104. When electrons flow from the floating gate 200 to the channel region 206, it is referred to as erasing. This flow of electrons from the floating gate 200 to the channel region 206 and vice versa occurs through a phenomenon known as oxide tunneling.

A problem arises when it is desirable to program one floating gate device 104 along a wordline 100 without programming the next floating gate device 104 on the same wordline 100. When a voltage is applied along a wordline 100, for example, wordline 100f of FIG. 1, the voltage is applied not only to the desired floating gate device 104a, but also to the next floating gate device 104b which is unselected for programming. The conventional method to avoid programming unselected floating gate devices 104b is to reduce the voltage differential between the gate 200 and the channel region 206 of the unselected floating gate device 104b or devices 104.

Figure 3:
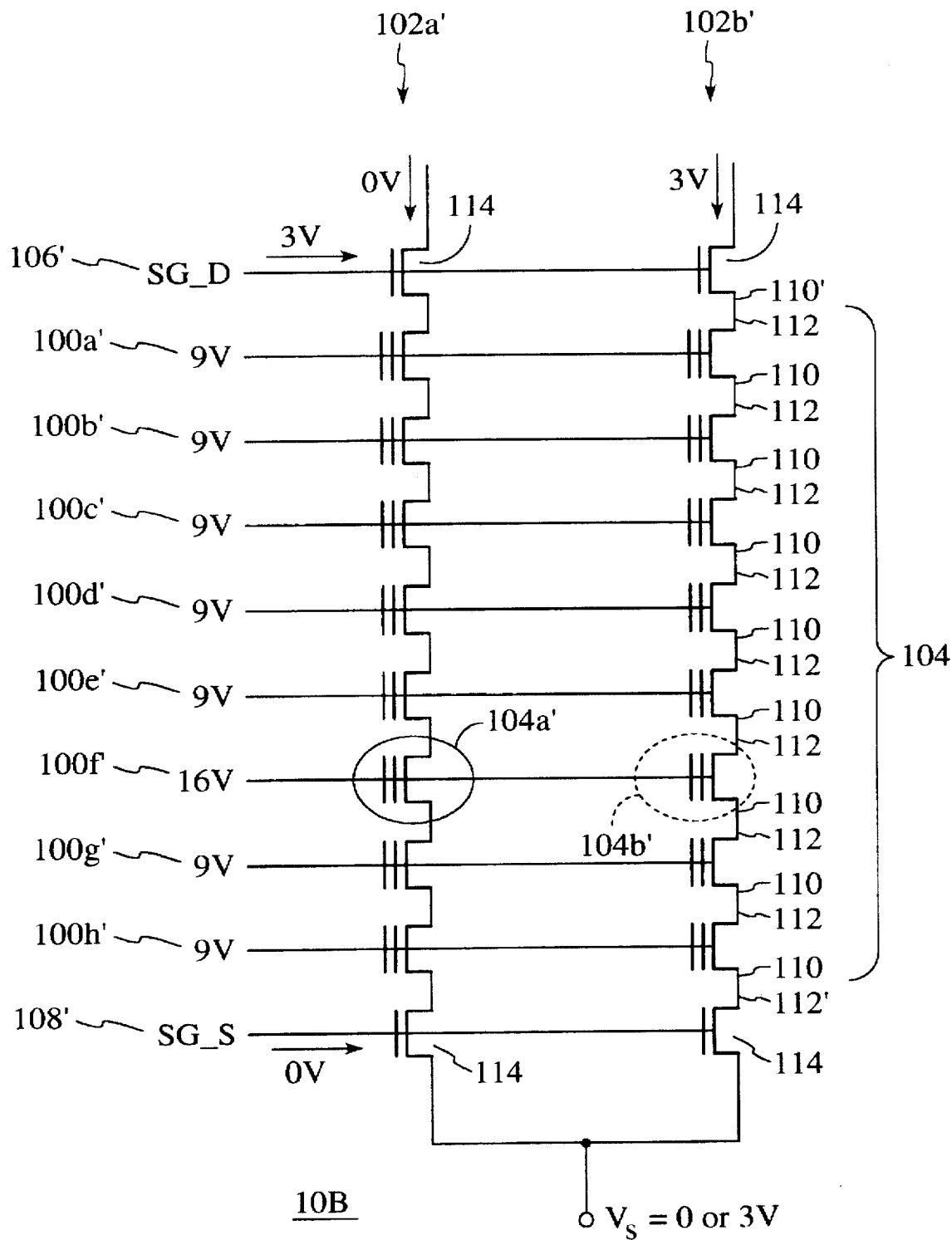
FIG. 3 is a conventional method and system of a program inhibiting scheme.

FIG. 3 illustrates one conventional system and method used to avoid programming unwanted floating gate devices. This system and method is used by companies such as Samsung, in their 4M*8 bit NAND Flash Memory, model KN29V32000TS-RS. In an example where a single floating gate device 104a' along bitline 102a' and wordline 100f is desired to be programmed, a high voltage such as 16 volts can be applied to wordline 100f. The remaining wordlines 100a'-100e' and 100g'-100h' can also have some small voltage applied to it such as 9 v. In order to avoid programming the next floating gate device 104b' along wordline 100f, the Flash memory 10B system charges the channel region 206 of the floating gate devices 104b' along bitline 102b' to a high enough voltage, for instance, 8 v, to avoid programming of the unselected floating gate device 104b'.

This charging of the channel regions 206 along bitline 102b' can be accomplished by providing a voltage, such as 3 volts, along the bitline 102b' and a voltage, such as 9 volts, along the wordlines 100. Once this has occurred, no current flows through the channel regions 206 of the floating gate devices 104 along bitline 102b' since the transistor 114 along bitline 102b' is turned off. In the example shown in FIG. 3, the difference between the 3 volts supplied along the select gate drain 106' and the 3 volts supplied along bitline 102b' is not greater than the threshold voltage of the transistor 114. Since this difference must be greater than the threshold voltage, such as 1 volt, of the transistor 114 to meet the requirement of turning the transistor on, no current passes along the floating gate devices 104 along bitline 102b'.

Figure 4:
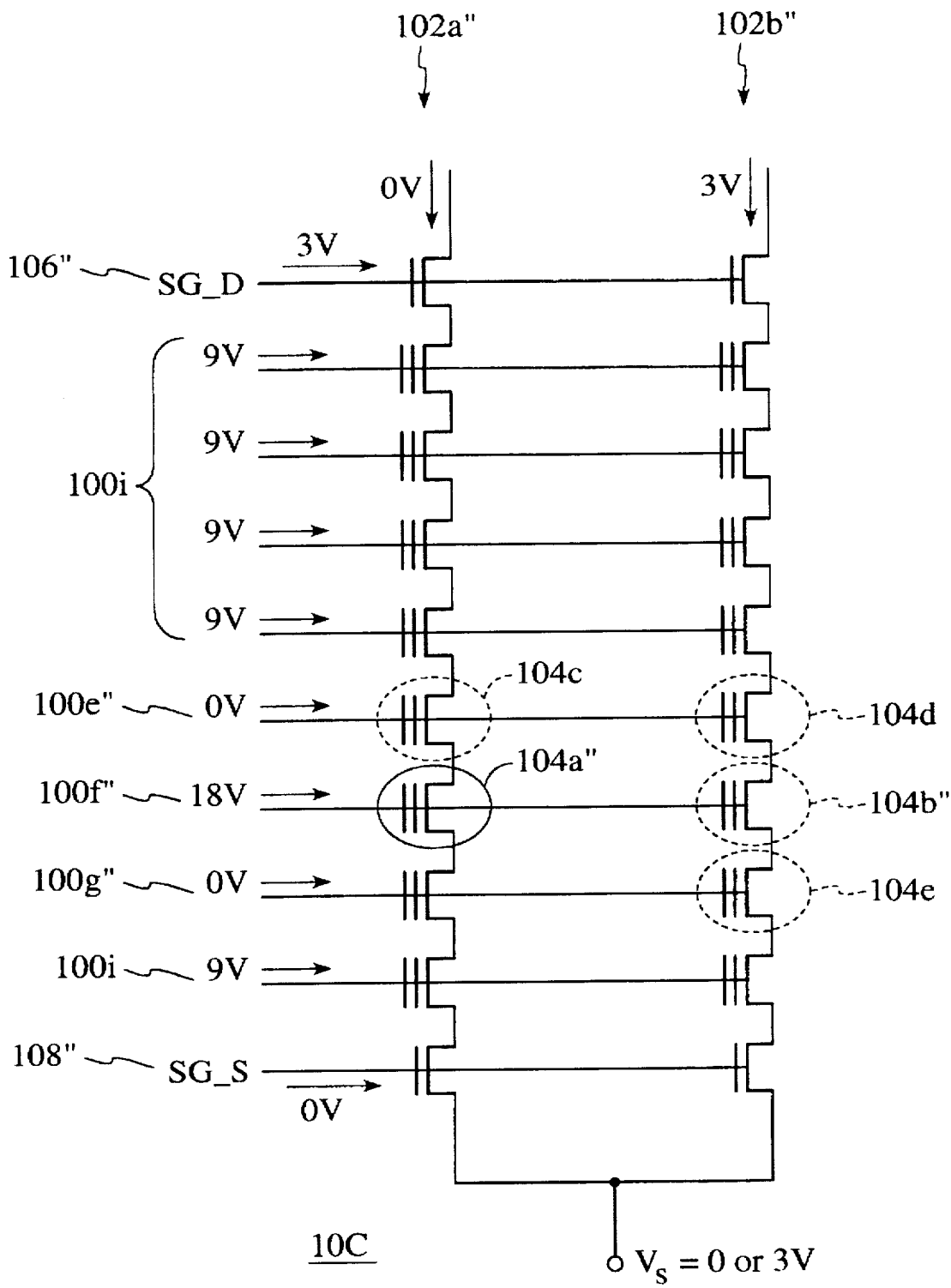
FIG. 4 is a conventional method and system of a program inhibiting scheme when a high voltage is applied to the programming wordline, which requires sequential programming.

FIG. 4 shows a Flash memory 10C in which it is desirable to apply a higher voltage to the wordline 100F" such as 18 volts. For example, the floating gate device 104A" is the desired floating gate device 104 selected for programming. It is desirable for all the remaining floating gate devices 104 to inhibit programming.

The method of program inhibit illustrated in FIG. 3 applies a voltage to the wordlines 100 to raise the potential of the channel region 206 of the floating gate devices 104. However, the maximum voltage which can be applied to the wordline 100 which is not being programmed is limited. This limitation is caused by unwanted programming along bitline 102A" of FIG. 4, if the voltage along wordline 100 becomes too high. When a high voltage, such as 18 volts, is applied along a desired wordline 100F", the maximum allowable voltage which can be applied to the remaining wordlines 100 is typically not high enough to keep unwanted floating gate devices 104 from programming.

The problem is when a high voltage is applied to wordline 100F", then it requires a higher channel region 206 voltage of the floating gate devices 104 along bitline 102B" to keep these floating gate devices 104 from unwanted programming. However, the maximum allowable voltage along the wordlines which are not being programmed is not high enough to raise the channel region 206 voltage to a sufficient potential.

One solution to this problem can be found in publications such as "A 3.3 V 32 Mb NAND Flash Memory with Incremental Step Pulse Programming Scheme", IEE J. Solid-State Circuits, Vol. 30, No. 11, 1995, P.1149, "A 3.3 V 128 Mb MultiLevel NAND Flash Memory for Mass Storage Applications", ISSCC96 Digest, 1996, p. 32.

A solution used by conventional Flash memory systems is illustrated in FIG. 4. In this example, a high voltage such as 18 volts is applied to wordline 100F" in which a floating gate device 104A" targeted for programming is located. In order to inhibit programming in the other floating gate devices 104 along the programming wordline 100F", the voltage in the channel region 206 of the remaining floating gate devices 104B" must be raised high enough to inhibit programming. In order to raise the voltage in the channel region 206 of the floating gate device 104B" to an appropriate level, the wordline 100F" is typically isolated. Isolation of the programming wordline 100F" can be accomplished by applying zero volts to the adjacent wordlines 100E" and 100G".

This isolation facilitates the program inhibit of floating gate devices 104B" by allowing the voltage in its channel region 206 to be raised high enough to inhibit programming. The isolation also facilitates a situation where the remaining wordlines 100I can utilize a voltage, such as 9 volts, which is less than or equal to the maximum allowable voltage which inhibits unwanted programming in all of the bitlines 102.

In the example shown in FIG. 4, the voltage in the channel region 206 of the floating gate devices 104 along wordline's 100I may be approximately 7 or 8 volts, while the channel region 206 voltage of the floating gate devices 104B" along the programming wordline 100F" may be approximately 9 or 10 volts. The voltage in the channel region 206 of the floating gate device 104B" can be boosted very high while the other floating gate devices 104 along wordlines 100I remain at the typical level illustrated in the example of FIG. 3.

In order for the system shown in FIG. 4 to properly function, the floating gate device 104C needs to be turned on while the floating gate device 104D needs to be turned off. The floating gate device 104C needs to be turned on in order to allow floating gate device 104A" to be programmed. In contrast, the floating gate device 104D needs to be turned off to ensure that the floating gate device 104B" is not programmed. As previously discussed, if the voltage difference between the floating gate 200, shown in FIG. 2, and the channel region 206 of the floating gate device 104 is large, then the floating gate device 104 will begin to program.

Consequently, the floating gate device 104C needs to be turned on to ensure that a high voltage differential occurs in the floating gate device 104A", while the floating gate device 104D needs to be turned off to ensure that the voltage differential in the floating gate device 104B" is small to inhibit programming.

To ensure that the adjacent floating gate device 104C is turned on, it needs to be erased. The criteria for a floating gate device 104 switching on is the following:

$$\left[\begin{pmatrix}\text{Gate}\\\text{voltage}\end{pmatrix}-\begin{pmatrix}\text{Voltage on}\\\text{channel region}\end{pmatrix}\right]>\begin{pmatrix}\text{Threshold}\\\text{voltage}\end{pmatrix}$$

The typical threshold voltage for a floating gate device 104 is approximately −2 volts for erase and approximately +1V for programming. In the case of the adjacent floating gate device 104C, the gate volt is zero and the source/drain volt is also zero. 0V−0V=0V, which is greater than −2V but less than +1V. Therefore, in order to ensure that the floating gate device 104C is on, the floating gate device 104C must be erased.

Due to the need for the adjacent floating gate device 104C being erased, the conventional system shown in FIG. 4 cannot be randomly programmed. The typical method used on this system is to erase all of the floating gate then program from the bottom working up sequentially. This inability to randomly program the floating gate devices 104 causes inadequate flexibility for many applications.

Another problem with the conventional system and method shown in FIG. 4 is that a band-to-band tunneling current can occur with the adjacent floating gate devices 104D and 104E. This band-to-band tunneling current raises the voltage differential in the floating gate device 104B" which can initiate unwanted programming.

The present invention is a system and method which allows random programming and avoids the problem with band-to-band tunneling current discussed above. In particular, the present invention applies a preferred voltage such as 2 volts along the wordlines adjacent to the programming wordline.

Figure 5:
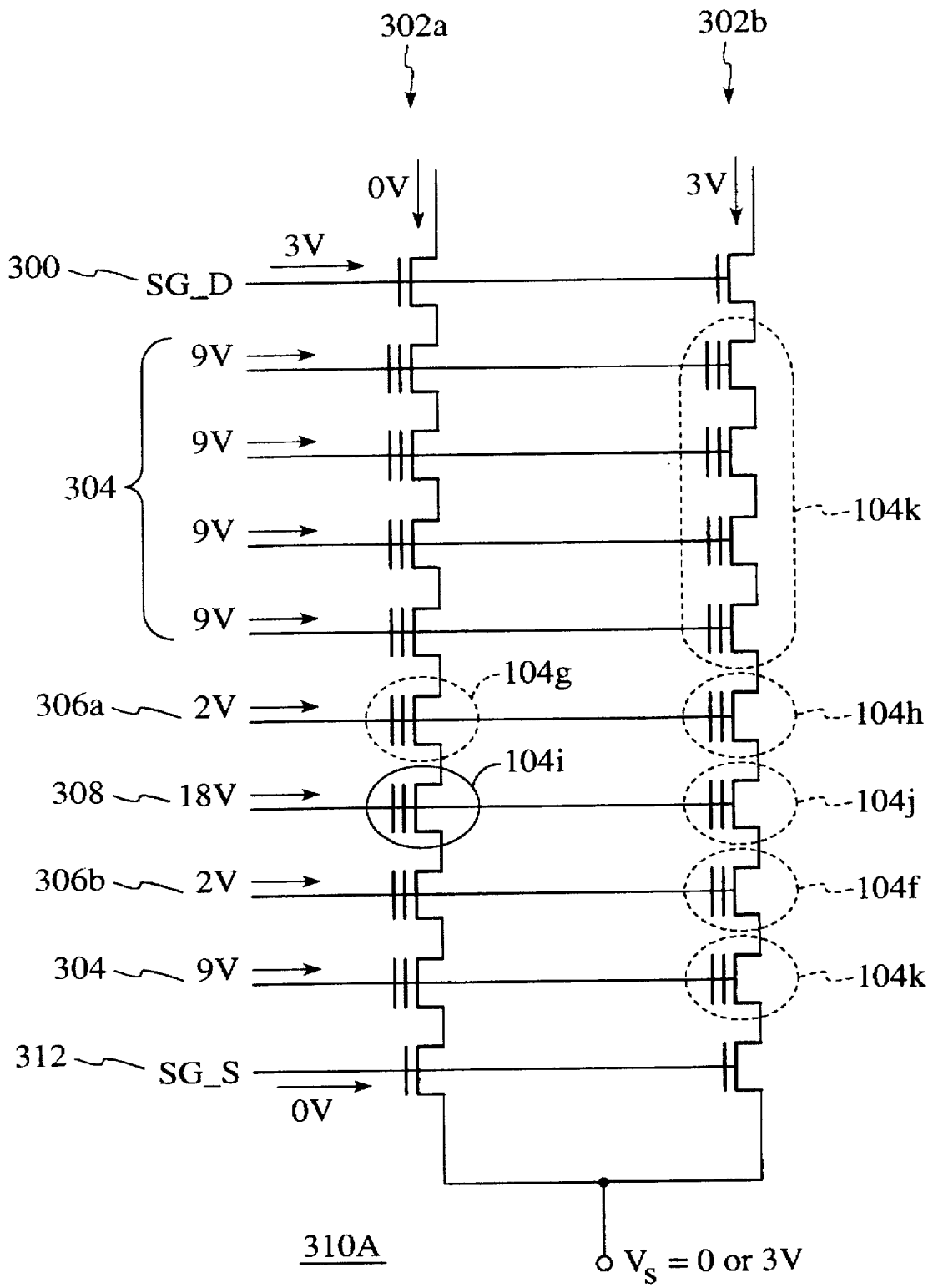
FIG. 5 is a method and system of a program inhibiting scheme when a high voltage is applied to a programming wordline according to the present invention, which allows random programming.

FIG. 5 shows an example of the system and method of the preferred embodiment of the present invention. FIG. 5 shows a Flash memory 310A which includes a select gate drain 300, a select gate source 312, a plurality of bitlines 302A–302B, a plurality of wordlines 304 which are not being programmed, a programming wordline 308, and wordlines 306A and 306B which are adjacent to the programming wordline 308. Assuming a situation where a high voltage is desired along the programming wordline 308, the target floating gate device 104I is desired to be programmed.

In the example shown in FIG. 5, 3 volts is applied to the select gate drain 300 while zero volts is applied to the target bitline 302A in which the target floating gate device 104I is located. Three volts is also applied to the remaining inhibit bitlines 302B to avoid programming. A voltage, such as 9 volts, is applied to wordlines 304 as part of the program inhibit method previously discussed.

When 2 volts are applied to the adjacent wordlines 306A and 306B, the adjacent floating gate device 104G will be switched on regardless of whether it is programmed or erased. If the floating gate device 104G is programmed, then the 2 volts (in the gate 200 of floating gate device 104G) minus zero volts (in the channel region 206 of the floating gate device 104G) is 2 volts, which is greater than the threshold voltage of a programmed floating gate device 104 of +1V. This meets the criteria for ensuring that the floating gate device 104G will be on. If the adjacent floating gate device 104G is erased, then the threshold voltage will be approximately −2 volts, which is still less than the difference between the gate voltage of 2 volts minus the voltage on the channel region 206 of zero volts.

Consequently, the system and method of the present invention can disregard the adjacent floating gate device's 104G state of programming or erasing. Since the present invention allows the target floating gate device 104I to be programmed regardless of the charged state of the adjacent floating gate devices 104G, it allows random programming.

Applying 2 volts along the adjacent wordlines 306A and 306B also fulfills the requirement of ensuring that the adjacent floating gate device 104H is off. The voltage on the channel region 206 of the floating gate device 104H will be somewhere between the voltage of its adjacent floating gate devices.

For purposes of this example, assume that the voltage on the channel region 206 of the floating gate devices 104K is approximately 7 volts, while the voltage along the channel region 206 of the floating gate device 104J can be assumed to be approximately 10 volts. Consequently, the voltage along the channel region 206 of the floating gate device 104H may be somewhere between the two channel region voltages, such as 8 volts. Since 2 volts minus 8 volts is greater than the threshold voltage of the floating gate device 104H (approximately −2 volts for erase; approximately +1 volts for program), the floating gate device 104H will be turned off.

The present invention also reduces the band-to-band tunneling current which occurred in the conventional systems illustrated in FIG. 4. By reducing the voltage differential between the floating gate device 104H and floating gate device 104J, and also reducing the voltage differential between the floating gate device 104J and the floating gate device 104F, the band-to-band tunneling current is minimized.

Figure 6:
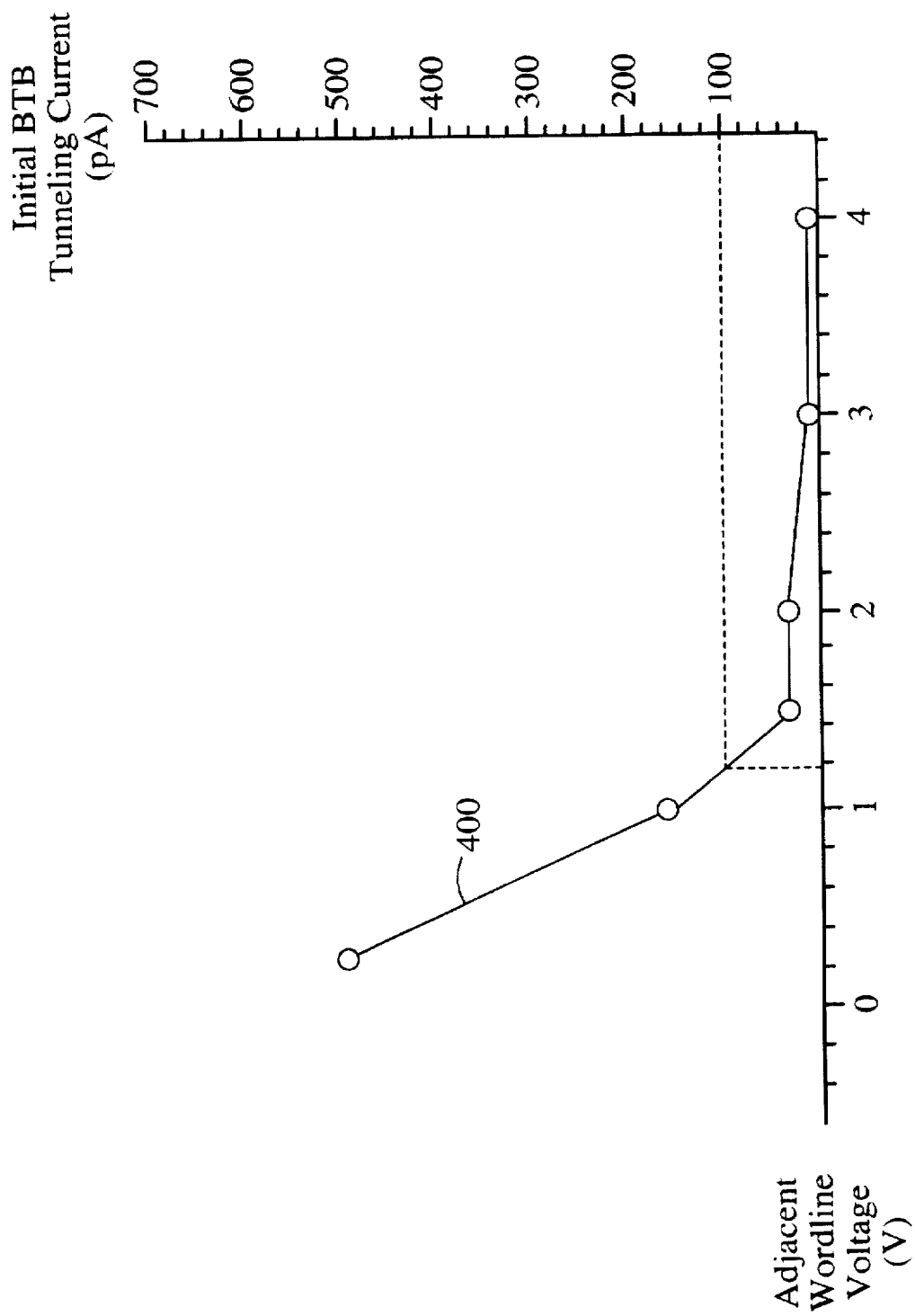
FIG. 6 is a graph of band-to band tunneling current in relation to adjacent wordline voltage.

FIG. 6 shows a graph of the band-to-band tunneling current as it varies with the voltage supplied along the adjacent wordline 306. Assuming that 100 pA is the point at which undesirable programming initiates, the voltage applied to the adjacent wordline 306 can be as low as approximately 1.2 volts to avoid a problem with the band-to-band tunneling current.

Although 2 volts is the preferred voltage to be applied along the adjacent wordlines 306, the voltage can vary between a given range. The voltage is preferably higher than the threshold voltage of the programmed floating gate devices 104 along the programming bitline 302A such as 1V in the given example. The voltage is also preferably lower than the sum of the threshold voltage and the lowest voltage along the channel region 206 of the floating gate devices 104K.

The maximum voltage which is preferred to be applied to the adjacent wordlines 306 varies depending on the threshold voltage and the voltage within the channel region 206 of the floating gate devices 104K. An example of calculating the preferred maximum voltage along the adjacent wordlines 306 can use the typical worst case of the threshold voltage in which the floating gate device 104 is erased. In most cases, the lowest threshold voltage for a floating gate device 104 can be approximately −3 volts. Given an example of the lowest voltage along the channel region 206 in a floating gate device 104K as being 7 volts, the preferred voltage of the adjacent wordlines 306 will be less than the sum of −3 volts and 7 volts. (Wordline volt<−3V+7V) Consequently, in this example, the preferred maximum wordline voltage of the adjacent wordlines 306 is less than four.

Figure 7:
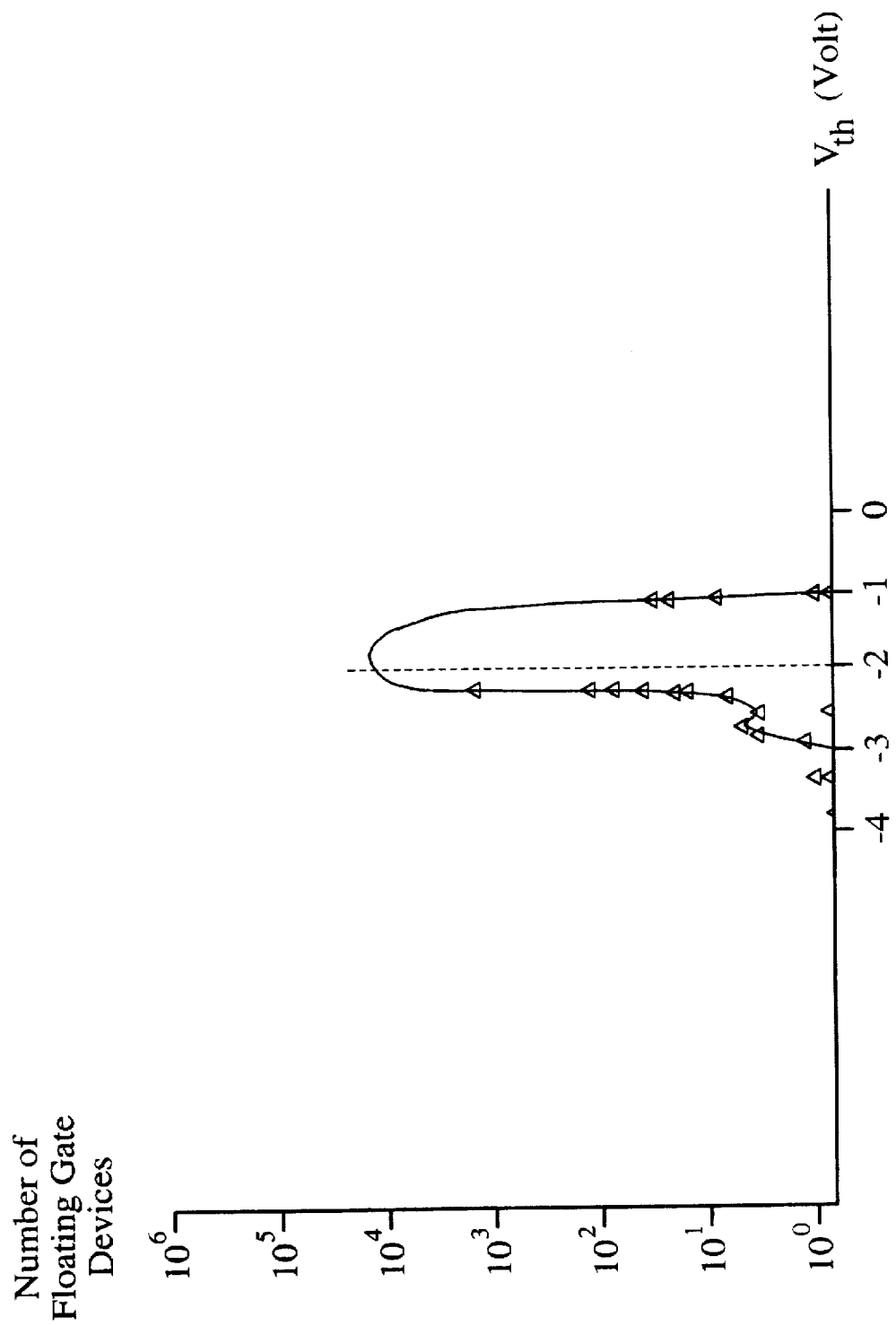
FIG. 7 is a graph of threshold voltage expectation.

FIG. 7 shows a graph of the number of floating gate devices falling within a range of a target threshold voltage such as −2 volts for an erase. Virtually all of the floating gate devices 104 will typically fall within a range of 1 volt within the target voltage. In this example, the target voltage of an erase is −2. Most of the floating gate devices 104 will fall within the range of −3 volts to −1 volt.

Note, however, that a small number of floating gate devices 104 will typically fall out of the range. There are several ways of dealing with this issue in the present invention. One solution is to control every erase threshold voltage to be above −3 volts. There are various ways of controlling the erase threshold voltage which are well known in the art. Another method of dealing with the eventuality of some floating gate devices 104 having an erased voltage below the expected range is illustrated in FIG. 8.

Figure 8:
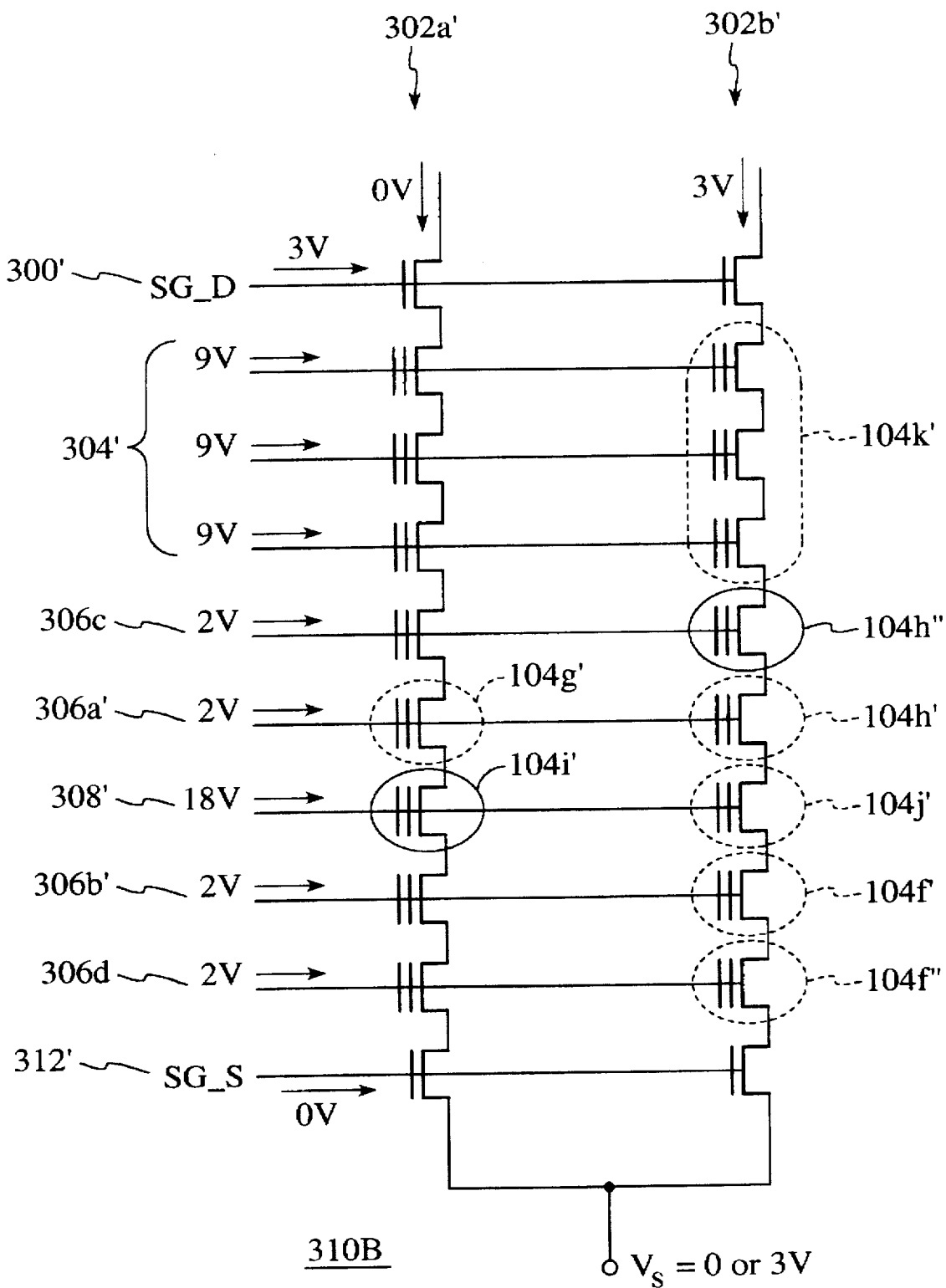
FIG. 8 is another embodiment of a method and system according to the present invention.

FIG. 8 illustrates another embodiment of the present invention. This system and method includes a select gate drain 300', a select gate source, 312', a plurality of bitlines 302A' and 302B', and a plurality of nonprogramming wordlines 304'. It also includes a programming wordline 308' and a plurality of adjacent wordlines 306A', 306B', 306C, 306D. The advantage of having a plurality of adjacent wordlines 306 is that it ensures predictability. The probability of both floating gate devices 104H' and 104H" having a threshold voltage falling below −3 volts approaches zero. This ensures a more reliable calculation of the preferred maximum adjacent wordline 306 voltage since the worst case threshold voltage can be assumed to be within 1 volt range of the target threshold voltage. In this example, the worst case threshold voltage is −3 volts.

A system and method in accordance with the present invention allows random programming of a Flash memory which also avoids the problem of band-to-band tunneling experienced in the conventional Flash memory systems. The potential problem of predicting a preferred maximum voltage to be applied along the adjacent wordlines 306 can be avoided by controlling the erase threshold voltage or by using a plurality of adjacent wordlines 306 as shown in the embodiment illustrated in FIG. 8.

Although the present invention has been described in accordance with the embodiments shown, the teachings of the present invention can also be applied to other Flash memory systems such as the one disclosed in U.S. patent application Ser. No. 08/668,632, entitled [internal docket JAS 549P/C072296]assigned to the same assignee as the present invention. One of ordinary skill in the art will recognize that there could be many variations to the embodiments described herein and those variations would be within the spirit and scope of the present invention. Accordingly, many modifications may be made by one of ordinary skill without departing from the spirit and scope of the present invention, the scope of which is defined by the following claims.

What is claimed is:

1. A method of programming in a Flash memory system comprising the steps of:
   (a) providing a first wordline coupled with a first device to be programmed, the first wordline also coupled with a second device to be program inhibited;
   (b) electrically isolating the second device;
   (c) programming the first device; and
   (d) programming a third device sequentially after the programming of the first device, the third device coupled with a second wordline, the second wordline not being adjacent to the first wordline.

2. The method of claim 1, further comprising step (a1) of providing approximately 18 volts along the first wordline.

3. The method of claim 1, wherein the step (b) includes the step of providing approximately 2 volts along a third wordline adjacent to the first wordline.

4. The method of claim 1, further comprising step (d1) of providing approximately 18 volts along the second wordline.

5. The method of claim 1, further comprising step (e) of providing approximately 2 volts along a fourth wordline adjacent to the second wordline.

6. A Flash memory system allowing random programming comprising:
   a first wordline coupled with a first device to be programmed, the first wordline also being coupled with a second device to be program inhibited, wherein the second device is electrically isolated;
   a second wordline coupled with a third device to be programmed sequentially after the programming of the first device, the second wordline not being adjacent to the first wordline.

7. The system of claim 6, wherein approximately 18 volts is provided along the first wordline.

8. The system of claim 6, further comprising a third wordline adjacent to the first wordline.

9. The system of claim 8, wherein approximately 2 volts is provided along the third wordline.

10. The system of claim 6, wherein approximately 18 volts is provided along the second wordline.

11. The system of claim 6, further comprising a fourth wordline adjacent to the second wordline.

12. The system of claim 11, wherein approximately 2 volts is provided along the fourth wordline.

13. A method of programming in a Flash memory comprising the steps of:
   (a) providing a first voltage to a first wordline, the first wordline being coupled to a first device to be programmed, the first wordline also being coupled to a second device to be program inhibited;
   (b) providing a second voltage along a channel region of a third device;
   (c) providing a third voltage to a bitline coupled with the first device; and
   (d) providing a fourth voltage to a second wordline adjacent to the first wordline, such that
      (i) the fourth voltage is less than the sum of
         (1) a threshold voltage of a fourth device adjacent to the second device, the fourth device being located between the second device and the third device, and
         (2) the second voltage, and
      (ii) the fourth voltage is also greater than the sum of
         (1) a threshold voltage of a fifth device adjacent to the first device; and
         (2) the third voltage.

14. The method of claim 13, wherein the fourth voltage is approximately 2 volts.

15. The method of claim 13, wherein the fourth voltage is provided to a plurality of wordlines.

16. The method of claim 13, further comprising step (e) of ensuring that the fifth device is on.

17. The method of claim 13, further comprising step (e) of ensuring that the fourth device is off.

18. A Flash memory system comprising:
   a first wordline with a first voltage coupled to a first device to be programmed, the first wordline also being coupled to a second device to be program inhibited;
   a third device with a second voltage along a channel region;

a bitline coupled with the first device, the bitline having a third voltage; and a second wordline adjacent to the first wordline, the second wordline having a fourth voltage such that:

the fourth voltage is less than the sum of a threshold voltage of a fourth device adjacent to the second device, the fourth device being located between the second device and the third device, and the second voltage, and the fourth voltage is also greater than the sum of a threshold voltage of a fifth device adjacent to the first device; and the third voltage.

19. The system of claim 18, wherein the fourth voltage is approximately 2 volts.

20. The system of claim 18, wherein the fourth voltage is provided to a plurality of wordlines.

21. The system of claim 18, wherein the fifth device is on.

22. The system of claim 18, wherein the fourth device is off.

* * * * *